US010739503B2

(12) United States Patent
Ouderkirk et al.

(10) Patent No.: US 10,739,503 B2
(45) Date of Patent: Aug. 11, 2020

(54) UNIFORM CHEMICAL VAPOR DEPOSITION COATING ON A 3-DIMENSIONAL ARRAY OF UNIFORMLY SHAPED ARTICLES

(71) Applicant: 3M INNOVATIVE PROPERTIES COMPANY, St. Paul, MN (US)

(72) Inventors: Andrew J. Ouderkirk, St. Paul, MN (US); Max Powers, Minneapolis, MN (US); Nicholas T. Gabriel, Woodbury, MN (US); Bill H. Dodge, Finlayson, MN (US); Erin A. McDowell, Afton, MN (US); Robert R. Kieschke, Woodbury, MN (US); Arokiaraj Jesudoss, Singapore (SG)

(73) Assignee: 3M Innovative Properties Company, St. Paul, MN (US)

( * ) Notice: Subject to any disclaimer, the term of this patent is extended or adjusted under 35 U.S.C. 154(b) by 94 days.

(21) Appl. No.: 15/105,949

(22) PCT Filed: Dec. 16, 2014

(86) PCT No.: PCT/US2014/070507
§ 371 (c)(1),
(2) Date: Jun. 17, 2016

(87) PCT Pub. No.: WO2015/100065
PCT Pub. Date: Jul. 2, 2015

(65) Prior Publication Data
US 2016/0306088 A1    Oct. 20, 2016

Related U.S. Application Data

(60) Provisional application No. 61/921,238, filed on Dec. 27, 2013.

(51) Int. Cl.
*G02B 5/30* (2006.01)
*G02B 1/08* (2006.01)
(Continued)

(52) U.S. Cl.
CPC .......... *G02B 5/3083* (2013.01); *C23C 16/442* (2013.01); *C23C 16/458* (2013.01);
(Continued)

(58) Field of Classification Search
CPC .......... G02B 5/30; G02B 5/3083; G02B 1/08; G02B 27/28; G02B 27/14; G02B 27/283;
(Continued)

(56) References Cited

U.S. PATENT DOCUMENTS 4,150,905 A    4/1979  Kaplan
5,380,551 A    1/1995  Blonder
(Continued)

FOREIGN PATENT DOCUMENTS

EP    0985742    3/2000
EP    1977025    10/2008
(Continued)

OTHER PUBLICATIONS

English translation of JP 59-043861, machine translated on Sep. 18, 2017.*

(Continued)

*Primary Examiner* — Jie Lei
(74) *Attorney, Agent, or Firm* — Clifton F. Richardson; Ann K. Gallagher

(57) ABSTRACT

The present invention is a method of coating uniformly shaped and sized articles. The method includes providing a reactor having an arrayed inner surface, positioning the articles within the reactor, and coating the articles.

16 Claims, 15 Drawing Sheets

(51) Int. Cl.
*G02B 27/28* (2006.01)
*C23C 16/455* (2006.01)
*G02B 27/14* (2006.01)
*C23C 16/458* (2006.01)
*C23C 16/442* (2006.01)

(52) U.S. Cl.
CPC .. *C23C 16/45502* (2013.01); *C23C 16/45546* (2013.01); *G02B 1/08* (2013.01); *G02B 27/14* (2013.01); *G02B 27/283* (2013.01); *H01L 2933/0025* (2013.01)

(58) Field of Classification Search
CPC . C23C 16/455; C23C 16/45546; C23C 16/40; C23C 16/442; C23C 16/45502; C23C 16/458; H01L 2933/0025
USPC .......... 59/486.01, 515; 427/165–167, 248.1, 427/249.1, 249.2; 428/403, 404
See application file for complete search history.

(56) References Cited

U.S. PATENT DOCUMENTS

| | | |
|---|---|---|
| 6,017,581 A | 1/2000 | Hooker et al. |
| 6,090,210 A | 7/2000 | Ballance |
| 2001/0018127 A1 | 8/2001 | David |
| 2003/0049372 A1* | 3/2003 | Cook ............... C23C 16/24 427/248.1 |
| 2003/0059530 A1 | 3/2003 | Klinedinst |
| 2006/0073276 A1 | 4/2006 | Antonissen |
| 2007/0163497 A1 | 7/2007 | Grace |
| 2011/0300297 A1 | 12/2011 | Celaru et al. |
| 2013/0243964 A1 | 9/2013 | Ling |
| 2014/0245266 A1 | 8/2014 | Sun |

FOREIGN PATENT DOCUMENTS

| | | | |
|---|---|---|---|
| JP | 59-043861 | * 12/1984 | ............ C23C 11/00 |
| JP | 03126901 | 5/1991 | |
| WO | WO 1999-27158 | 6/1999 | |
| WO | WO 1999-50474 | 10/1999 | |
| WO | WO 2006-042074 | 4/2006 | |

OTHER PUBLICATIONS

Stein, Morphological Control in Colloidal Crystal Templating of Inverse Opals, Hierarchical Structures, and Shaped Particles, Chemistry of Materials, XP055086097, vol. 20, No. 3, Feb. 1, 2008, pp. 649-666.

International Search Report for PCT International Application No. PCT/US2014/070507, dated Mar. 24, 2015, 3pgs.

Sechrist, "Modification of Opal Photonic Crystals using $Al_2O_3$ Atomic Layer Deposition", Chemistry of Materials, 2006, vol. 18, pp. 3562-3570.

* cited by examiner

UNIFORM CHEMICAL VAPOR DEPOSITION COATING ON A 3-DIMENSIONAL ARRAY OF UNIFORMLY SHAPED ARTICLES

TECHNICAL FIELD

The present invention is related generally to methods of coating. In particular, the present invention is a method of applying a coating onto uniformly shaped and sized articles.

BACKGROUND

In a remotely illuminated phosphor package, light from one or more ultraviolet or blue pump LEDs is imaged by a hemispherical lens onto a phosphor-containing layer that is approximately adjacent and coplanar to the LEDs. Excellent color uniformity for a single LED, and within a lot of LEDs can be achieved by using precise and accurate optical coatings over the surface of the hemispherical surface that reflect a large percentage of blue light and transmit a high percentage of red and green light.

Two methods of making optical coatings have proved to provide the necessary coating precision and accuracy required with remotely illuminated phosphor packages; low pressure chemical vapor deposition (LPCVD) and atomic layer deposition (ALD). LPCVD uses reactive gases at about 1 Torr of pressure to deposit typically inorganic oxide coatings on a refractory surface. LPCVD provides high deposition speeds and excellent coating uniformity over a single optical element. LPCVD deposition is determined by reaction kinetics at solid surfaces, so gas velocity and history affect coating speed. The effect of the flow history has a significant effect on coating precision. ALD uses saturated physisorption or chemisorption, or a combination of both, to limit coating thickness in any one coating step. Very accurate and precise coatings can be produced using ALD, assuming that all surfaces have enough exposure to the reactant to develop a saturated adsorbed layer of reactant or reactant-modified surface, and that the purge time is sufficient to remove excess reactant and reaction products.

Both coating processes can be relatively time consuming, with LPCVD taking 1 or more hours to develop a micron thick coating, and ALD taking 10 hrs or more for the same coating thickness. Therefore, in order to produce low cost coatings, a significant number of optical elements must be coated at the same time. However, loading a number of optical elements into a reactor can create non-uniform gas flows. For LPCVD, this can cause some optical elements to have too thick a coating, and some elements too thin a coating. While ALD is less affected by the non-uniform gas flow, the coating time can be substantially lengthened due to the fact that the optical element surface receiving the least amount of gas flow limits the coating speed.

The way that the optical elements fill the reactor can also have a significant effect on coating cost and quality. For example, a regular array with spaces can give high quality coatings, but at the cost of lower packing density. Reducing packing density reduces the potential throughput of the system, and assuming that the substrates or optical elements take up volume, can increase mixing within the reactor. Mixing can increase reactant and purge cycle times in ALD systems. Reduced packing density also reduces throughput of both ALD and LPCVD systems.

Another approach to filling reactors is to create a randomly packed volume of elements. This approach is used for coating powders. One advantage of random packing is that the reactor is inexpensive to build and can be quickly filled and emptied. A disadvantage is that random packing has a lower packing density than when the elements are packed in a regular array. Regular arrangements can include face-centered cubic (FCC) or hexagonal close pack (HCP) arrays. While the lower packing density can have the advantage of lowering flow resistance, this benefit comes at a significant cost of increased reactant volume, commensurately lower flow rates, and non-uniformity of flow. FIGS. 1A and 1B show a simulation of the flow profile through an ALD reactor 10. FIG. 1A shows the reactor filled with a HCP array of spheres 12. FIG. 1B shows a top, cross-sectional view of the spheres in FIG. 1A. Throughout the specification, the shading indicates velocity, with lighter shading indicating low velocity and darker shading indicating high velocity. Thus, in FIGS. 1A and 1B, the lighter shading between the spheres indicates low velocity, the medium shading around the perimeter of the cluster of spheres indicates medium velocity, and the darker shading at the very outer perimeter of the reactor indicates high velocity. The flow conditions are an outlet pressure of 1 Torr, 20 sccm (standard cubic centimeters per minute) of nitrogen, and the reactor temperature is 200° C. The simulation was made with Solidworks 2012 flow simulator sold by Dassault Systemes Corp, Velizy, France.

SUMMARY

In one embodiment, the present invention is a method of coating uniformly shaped and sized articles. The method includes providing a reactor having an arrayed inner surface, positioning the articles within the reactor, and coating the articles.

In another embodiment, the present invention is a reactor for coating uniformly shaped and sized articles. The reactor includes an inner arrayed surface, wherein the inner arrayed surfaces matches a profile of adjacent articles.

In yet another embodiment, the present invention is an article having a plurality of contact points. Adjacent contact points are spaced between about 25 to about 35 degrees from each other.

These figures are not drawn to scale and are intended merely for illustrative purposes.

DETAILED DESCRIPTION

The reactor and method of the present invention allow a plurality of articles, such as optical elements, to be uniformly and efficiently coated. The reactor also allows simultaneous coating of a plurality of optical elements in part by allowing a uniform reaction between two reactants. Reactors that have very uniform and reproducible flow conditions have the advantages of higher coated optical element yields and rates and reduced inspection requirements. For example, very uniform and reproducible flow conditions allow shorter purge times for atomic layer deposition (ALD) cycles, resulting in shorter overall coating time and lower cost. It should be noted that while the figures and specification depict and refer to the optical elements as hexagonal glass spheres, the optical elements may be of any shape and made of any material without departing from the intended scope of the present invention. For example, the optical elements may be spheres, lenses, or other shapes. In addition, although the specification refers to the articles as optical elements, the articles may be any element to be uniformly coated.

Figure 2A:
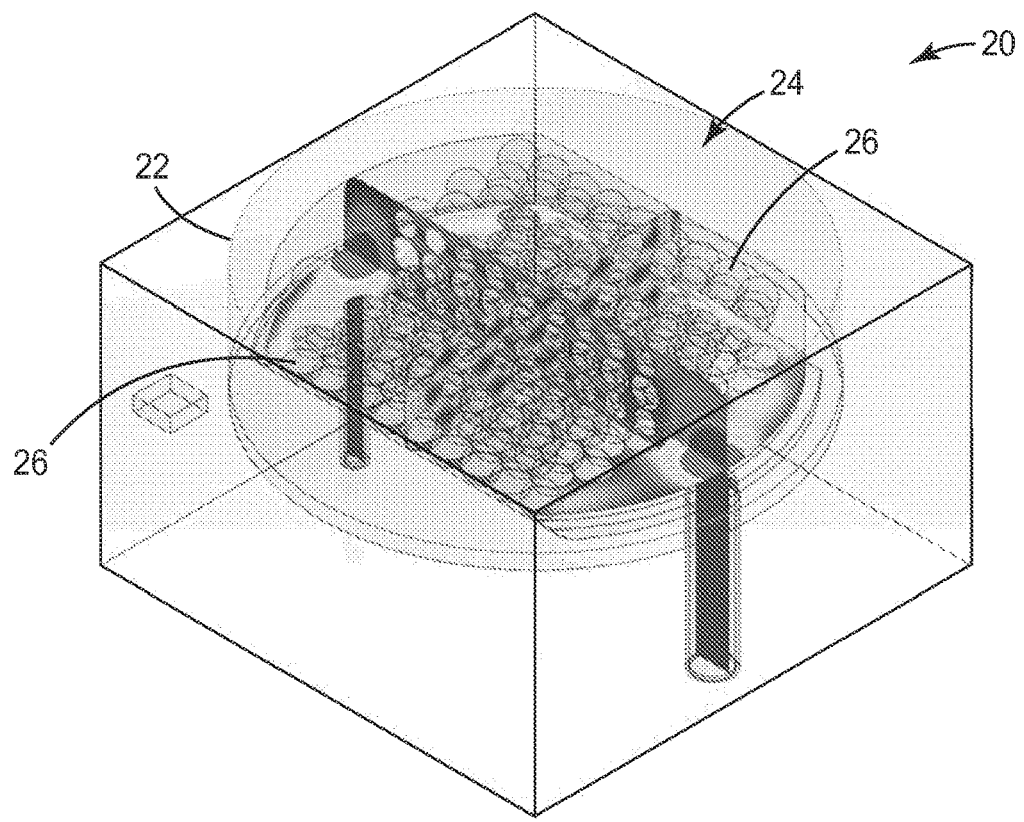
FIG. 2A shows a perspective view of a simulated flow profile through a first embodiment of a reactor of the present invention.
Figure 2B:
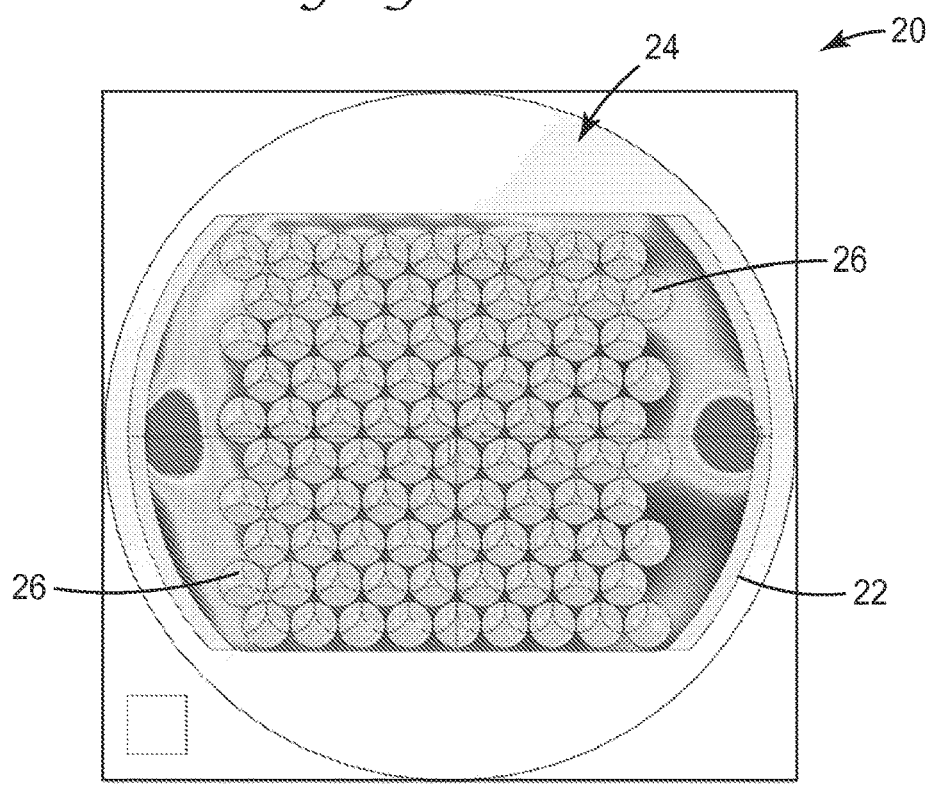
FIG. 2B shows a top view of the simulated flow profile through the first embodiment of the reactor of FIG. 2A.

FIGS. 2A and 2B show a schematic perspective view and a top view, respectively, of one embodiment of a reactor 20 of the present invention and the flow profiles created by the reactor. The side walls 22 and top wall 24 of the reactor 20 are designed to be adjacent to the outermost optical elements 26 in the reactor 20. As can be seen by the shading in FIGS. 2A and 2B, when the walls 22, 24 of the reactor 20 are adjacent to the optical elements 26, the reactant is effectively directed through the array of the optical elements 26, creating a more uniform flow. In the construction of the reactor 20 shown in FIGS. 2A and 2B, excess volume is eliminated, creating a semi-infinite boundary condition. In a semi-infinite boundary condition, there are higher flow rates along the sides of the reactor due to increased spacing between the outermost optical elements 26 and the reactor walls 22, 24.

Figure 1A:
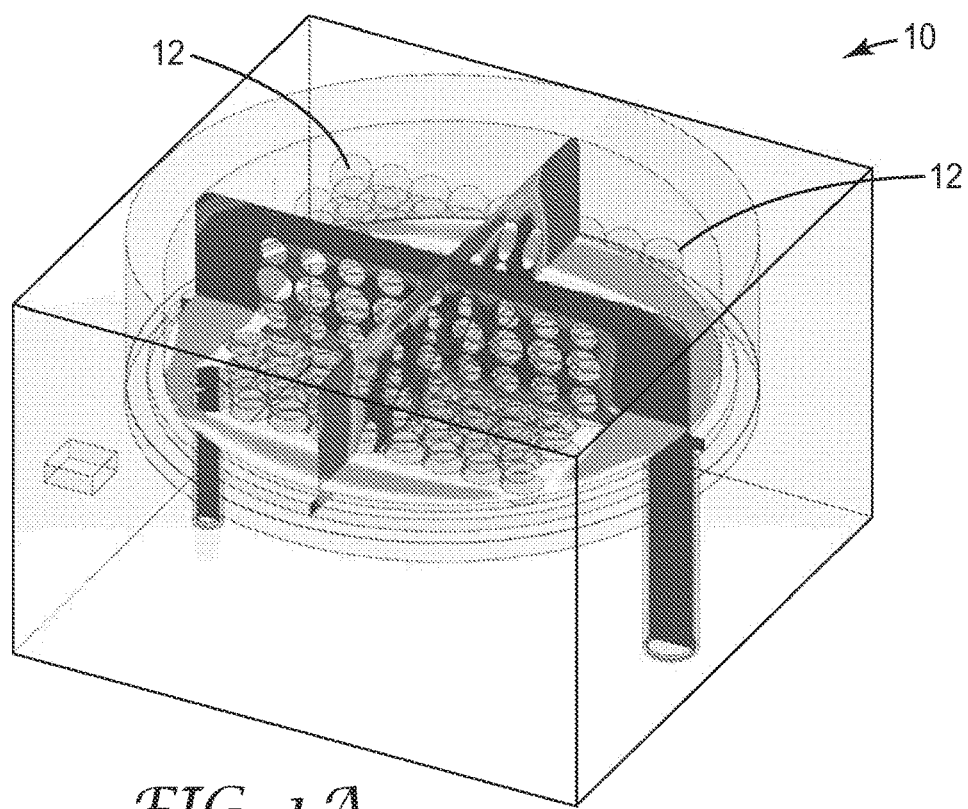
FIG. 1A shows a perspective view of a simulated flow profile through a prior art ALD reactor.
Figure 1B:
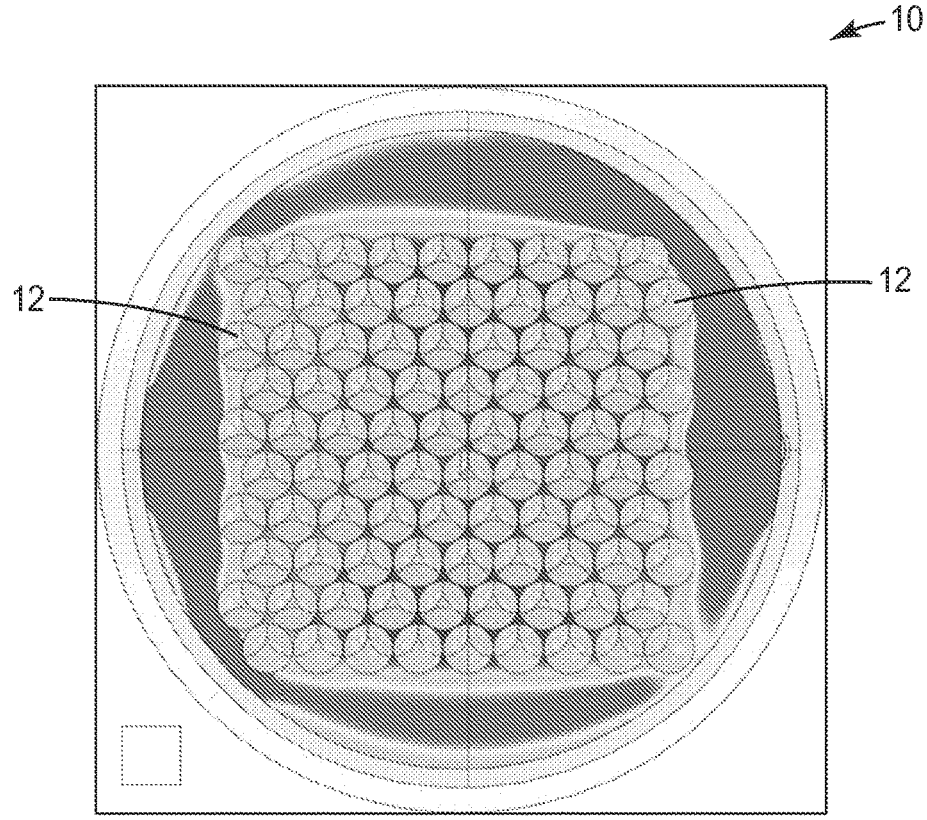
FIG. 1B shows a top view of the simulated flow profile through the prior art reactor of FIG. 1A.

While the reactor design shown in FIGS. 2A and 2B show improved flow design over the prior art design shown in FIGS. 1A and 1B, there is still some non-uniformity of flow with a semi-infinite boundary condition. For example, in a low pressure chemical vapor deposition (LPCVD) system, the optical elements 26 near the reactor walls 22, 24 are adjacent to high-velocity gas flows and may develop a relatively thick optical coating. Alternatively, in an ALD system, the optical elements near lower-velocity gas flows will have lower exposure to reactants and purge gas, increasing the amount of time required to deposit the desired coating.

Figure 3A:
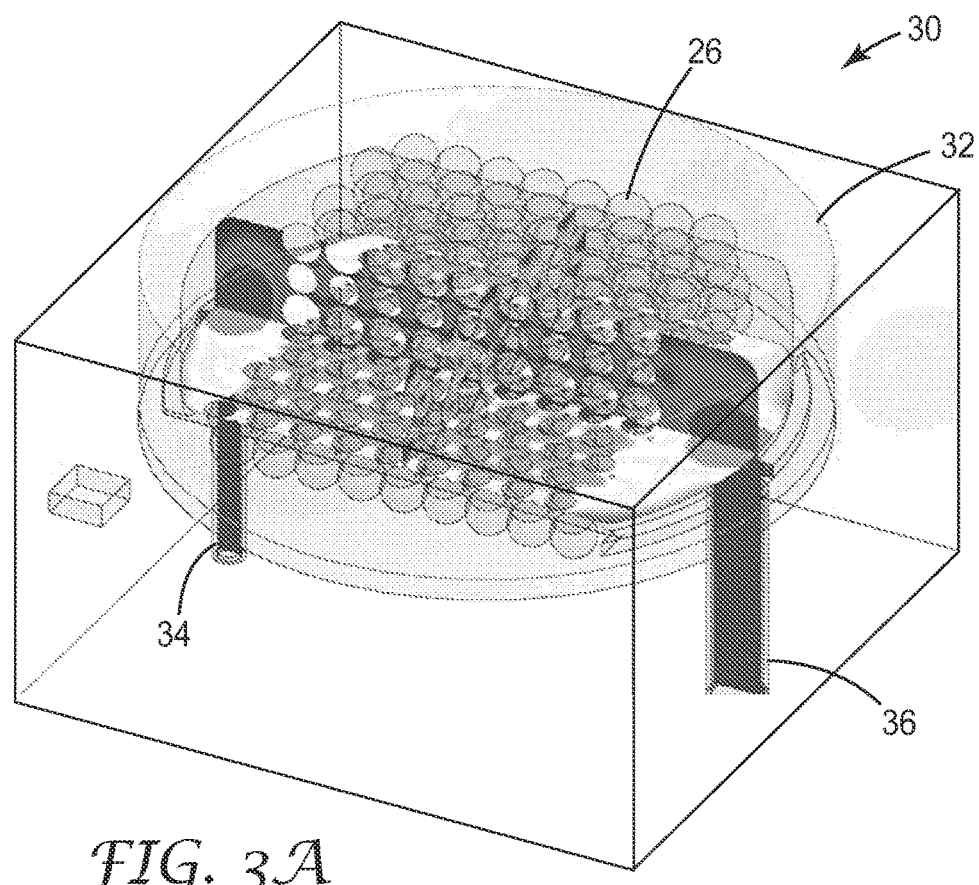
FIG. 3A shows a perspective view of a simulated flow profile through a second embodiment of a reactor of the present invention.
Figure 3B:
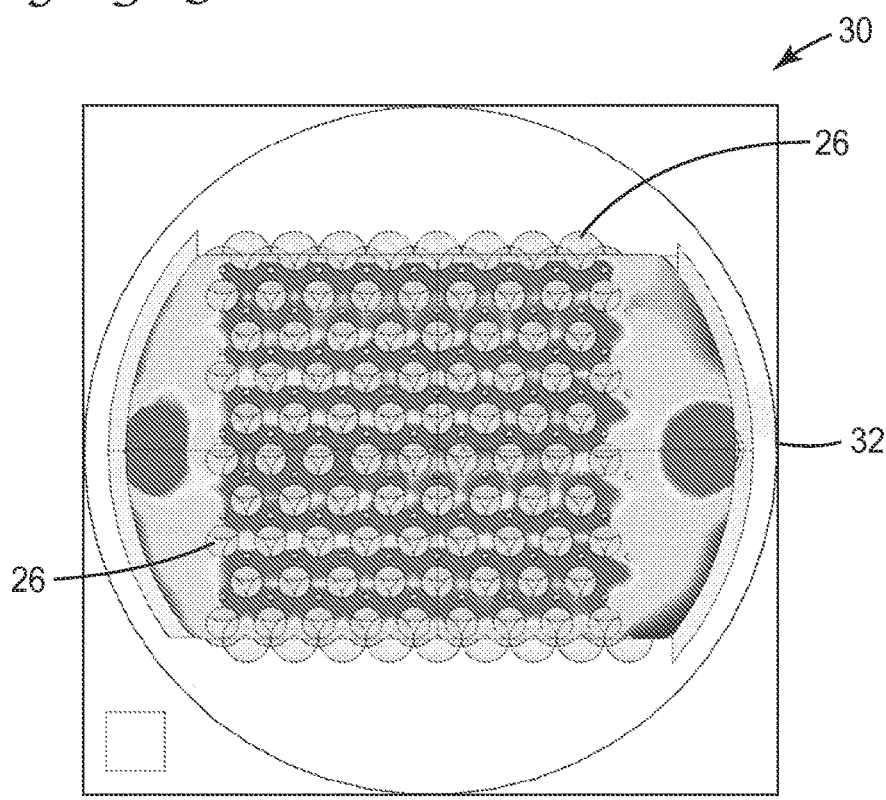
FIG. 3B shows a top view of the simulated flow profile through the second embodiment of the reactor of FIG. 3A.

The reactor design can be further improved by using a more symmetrical array of optical elements and by extending the repeating boundary conditions from the sides of the reactor to at least one of the entrance or the exit of the reactor. FIGS. 3A and 3BA show a schematic perspective view and a top view, respectively, of a second embodiment of a reactor 30 and the flow profiles created by the reactor 30 in which the repeating boundary conditions are extended from the sides walls 32 of the reactor 30 to at least one of the entrance 34 or the exit 36 of the reactor 30. The flow profiles of the reactor shown in FIGS. 3A and 3B show that creating an infinite boundary condition on the four walls that are perpendicular to the average flow direction can substantially improve the flow velocity around the optical elements. The flow between the spheres is at high velocity and substantially uniform.

Figure 4:
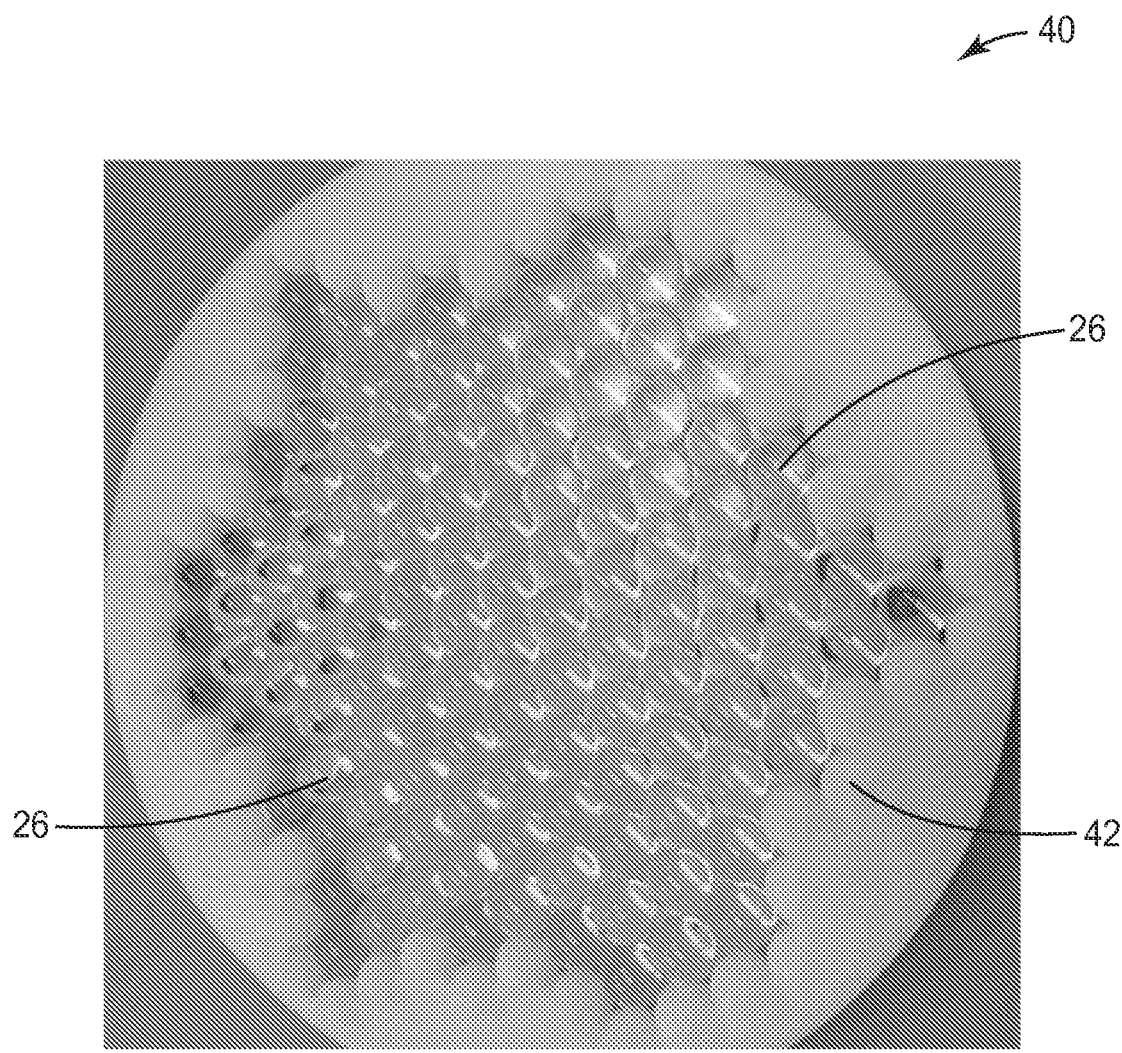
FIG. 4 shows a top view of a first layer of optical elements in an exemplary full transition boundary reactor.

FIG. 4 shows a perspective, top view of a first layer of optical elements 26 in an exemplary full transition boundary reactor 40. The full transition boundary reactor 40 has side 42, bottom 44 (not shown) and top walls 46 (not shown) that are arrayed and correspond and conform to the shape of the outermost optical articles 26, creating an infinite boundary condition. Arrayed surfaces are surfaces that extend the structure of the optical elements 26. The arrayed surfaces provide a transition from the reactor walls 42, 44, 46 to the arrayed optical elements 26, where reactant flow adjacent to the optical elements 26 next to the reactor walls 42, 44, 46 is similar to the flow for optical elements 26 that are surrounded by other optical elements 26. This infinite boundary condition is present in a full transition boundary reactor. Thus, the full transition boundary reactor 40 has bottom 44 and side walls 42 with arrayed surface structures of partial spheres. An infinite boundary condition can be accomplished, for example, by machining the surface areas of the reactor and then loading the reactor with the optical elements.

In an infinite boundary condition, the minimum gas flow velocity for a given optical element is similar to the average gas flow velocity for all optical elements. This provides a benefit for both ALD and LPCVD processes. With ALD, the coating rate is partially determined by reactant-purge cycle time, which is determined by the lowest reactant exposure and slowest purge time, so reducing the difference between the minimum and average gas flow velocities reduces the overall ALD coating time. This small difference will also improve LPCVD coating variations. In addition, the maximum gas flow velocity for a given optical element is similar to the average gas flow velocity for all optical elements. This improves LPCVD coating variability, increases the utilization of reactants in either process, and improves purging between coating cycles in ALD. The infinite boundary condition also produces nearly plug flow conditions which allows a uniform reaction between reactants in ALD. This allows the reactor to be used in a hybrid mode between ALD and LPCVD, where a reactant is not fully purged before the next reactant flow begins. Another advantage of the infinite boundary condition is that the uniformity of coating between optical elements allows the possibility of doing quality assurance through audits rather than 100% inspections, particularly if the entrance and exit rows are separated from the rest of the optical elements.

As an example, a conservative ALD half cycle for a small reactor may be 0.2 seconds of reactant flow (A or B) followed by 20 seconds of purge (P). The purpose of the purge is to remove excess reactant and reaction products from the surfaces of the optical elements and from the reactor between reactant half cycles. Reducing purge time is an effective way to reduce cost. As the purge time is reduced for a given reactor, the reactants A and B will begin reactions outside the pure ALD mode where saturated sub-monolayers form during each half cycle. In other words, the reactants A and B will begin to react through a combination of reactants in the gas phase, or react to multiple adsorbed layers on the optical elements. These reactions can be acceptable, or even desirable if they are uniform in the reactor.

Figure 5A:
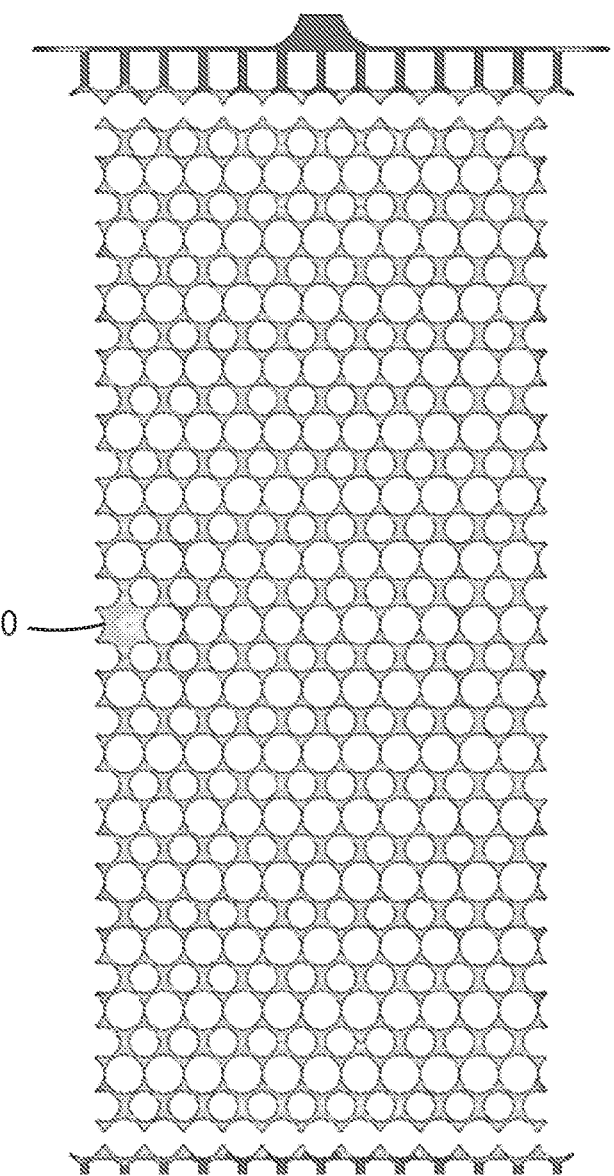
FIG. 5A shows a cross-sectional view of the impact of eliminating a single optical element from a packed array.
Figure 5B:
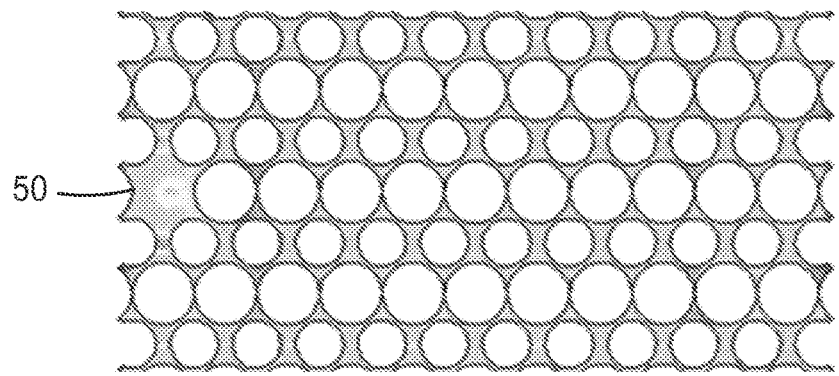
FIG. 5B shows an enlarged cross-sectional view of the impact of eliminating a single optical element from the packed array of FIG. 5B.
Figure 6:
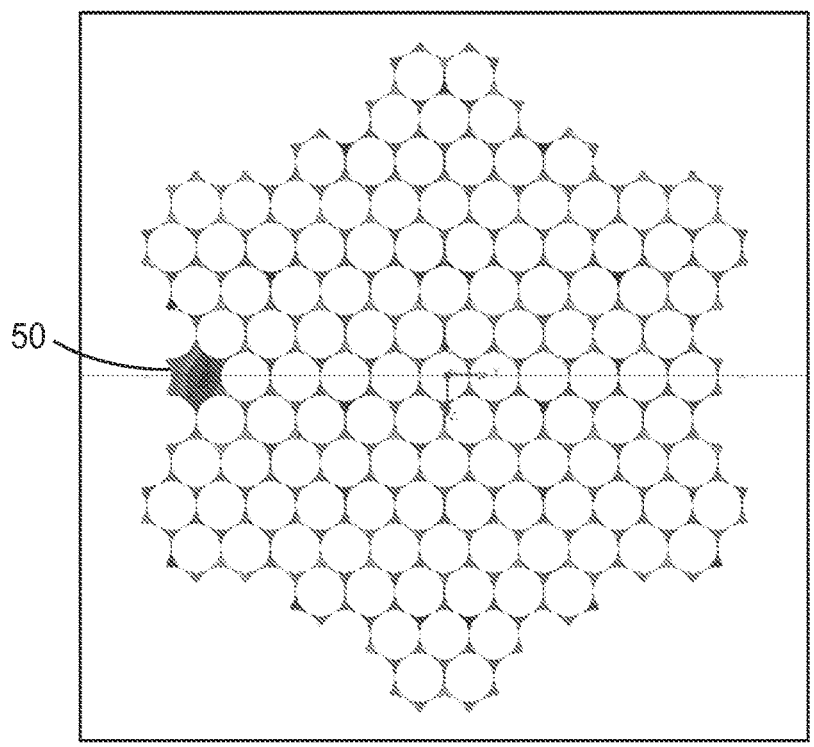
FIG. 6 shows a cross-section of the impact of eliminating a single optical element from a packed array of FIGS. 5A and 5B.

The manner in which the optical elements are packed in the reactor is critical. FIGS. 5A and 5B show the impact of eliminating a single optical element 50 in a packed array. FIG. 6 shows a cross-sectional view of the reactor conditions of FIGS. 5A and 5B. As can be seen in the figures, even a single defect can have a substantial effect on flow. As shown in the figures, there is a region of high velocity at the location of the missing optical element and a region of lower velocity to the right. This difference in velocity can result in longer cycle times and/or non-uniform deposition. A series of defects can further aggravate the issue. In addition, as the size of the optical elements decreases and a larger number of optical elements exist within a given volume, defects may become even more prominent.

In addition to defects, the fixed reactor diameter requires that the packed optical elements fit within the dimensions of the boundary wall such that the packed optical elements have a diameter that substantially fits within a diameter of the reactor. For example, if the diameter (or other suitable characteristic length) of the optical elements on average is slightly larger than the specified parameter, it would not be possible to fit the entire array layer of optical elements within the boundaries. In such a case, it may be necessary to replace one or more optical elements with properly sized optical elements. Another option would be to heat the reactor assembly to allow for thermal expansion of the reactor. Heating can be continued up to the intended temperature at which coating will take place. This assumes that the coefficient of thermal expansion (CTE) of the reactor material is greater than that of the optical elements being placed inside. In such a case, extraction of the optical elements must also be done at the same temperature. Allowing the system to cool may generate enormous stress on the reactor and article array.

The reactor of the present invention allows for a coating to be uniformly applied to uniformly shaped and sized optical elements. In one embodiment, the coating is applied to the optical elements in a chemical vapor deposition system where the reactor forms a semi-infinite boundary condition for managing uniform reactant flow for all optical elements in the three-dimensional array. This is accomplished by having at least one wall surface of the reactor being arrayed and in contact with the outermost layers of the optical elements, causing reactant flow that is similar to flow between optical elements.

Figure 7:
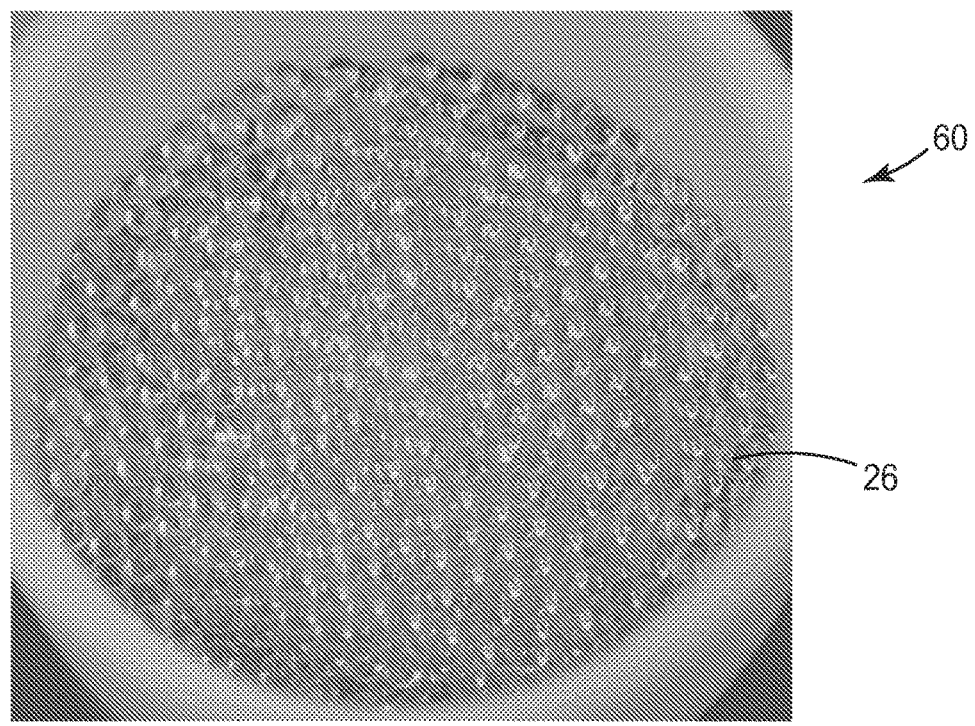
FIG. 7 shows a top view of a randomly packed volume within a reactor.

FIG. 7 shows an example of a randomly packed volume within a reactor 60. The optical elements 26, in this case spheres, are packed in a combination of amorphous regions and crystalline regions. As previously mentioned, randomly packing the reactor may allow for either poor coating uniformity in a batch of spheres, or slow coating time, or both. One way to increase reactor throughput is to fill the reactor with a bimodal distribution of sizes of optical elements. For example, 10 mm spheres can be combined with 4 mm spheres to increase packing density.

Figure 8:
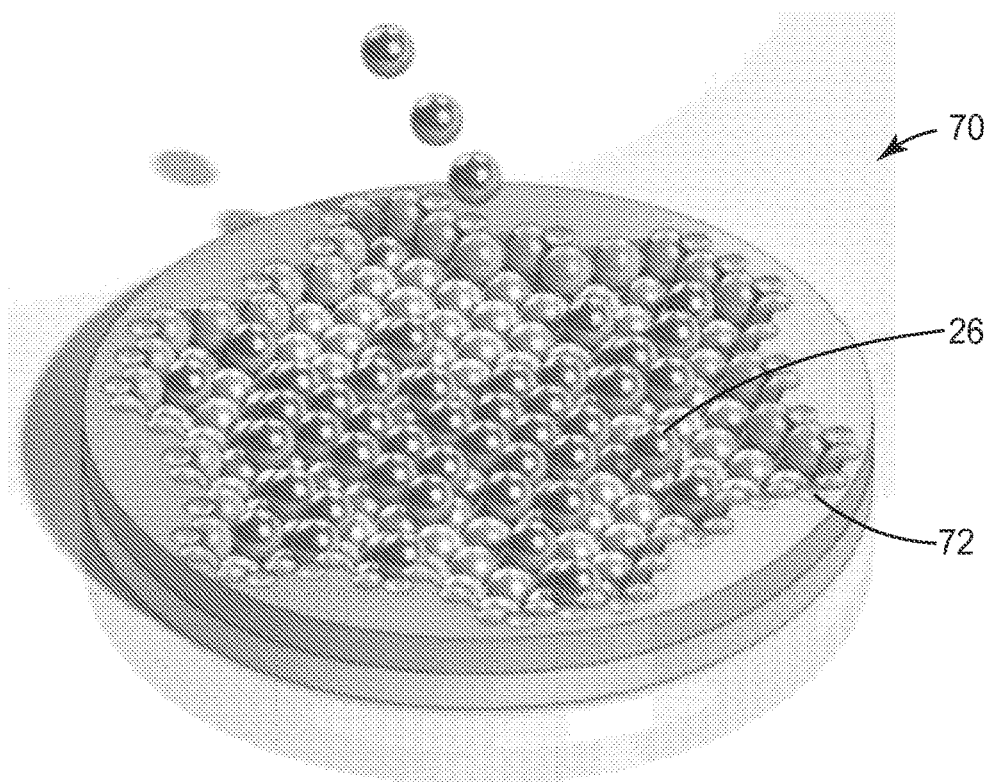
FIG. 8 shows a first step of packing a reactor of the present invention using a first method.

In a first method of the present invention of packing a reactor 70, the reactor is filled using layer by layer packing and assembly. Utilizing a reactor with a stackable modular design, the desired packing can be achieved by first stacking the base and a single side wall boundary 72 as shown in FIG. 8.

Figure 9:
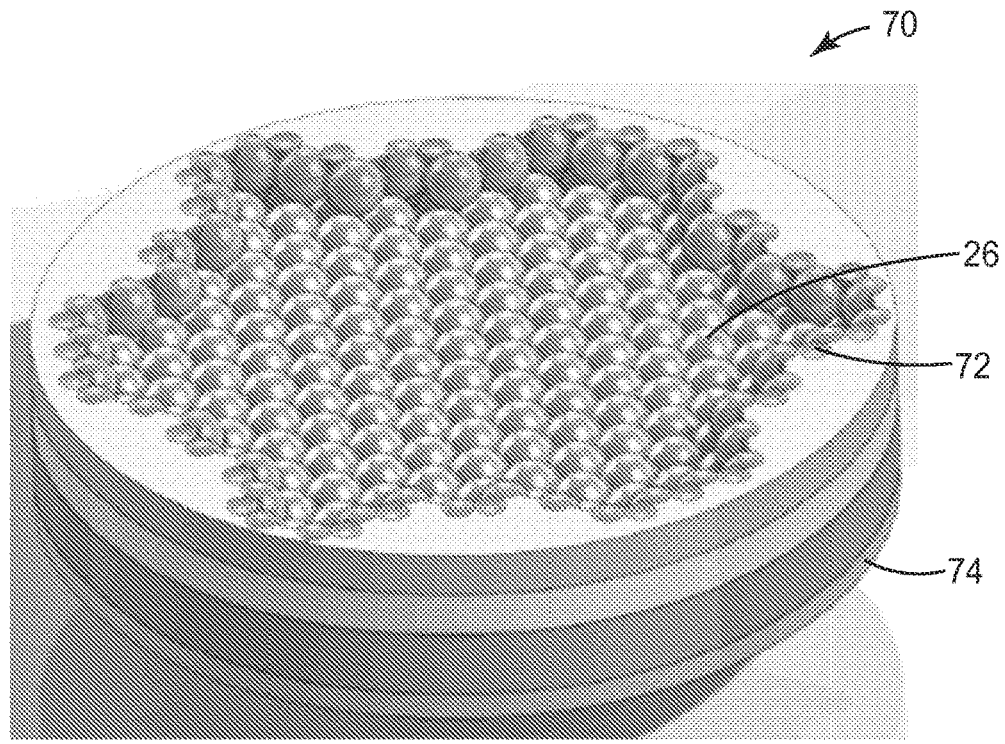
FIG. 9 shows a second step of packing a reactor of the present invention using a first method.

The optical elements 26 can be dispensed, for example, from a reservoir of optical elements existing in a randomly packed state, into a first layer of the reactor at a controlled rate. The optical elements 26 can be dispensed by any means known in the art, for example, via a funnel, manually, or an automated dispensing process. In one embodiment, the optical elements 26 fill the reactor one-by-one from some height above the plane of the base component 74, within the perimeter of the side wall 72, as shown in FIG. 9. In one embodiment, as optical elements 26 are being dispensed into the reactor 70, vibrations of suitable magnitude and frequency may be imposed on the reactor 70 via mechanical means or sound. The vibrations serve to offset any optical elements 26 that may have started to stack more than one layer high and have them fall into a lower gravitational state. These vibrations may be axial and/or radial in nature. As an alternative to reactor vibration, manual manipulation of the dispensed optical elements can also be performed.

Figure 10:
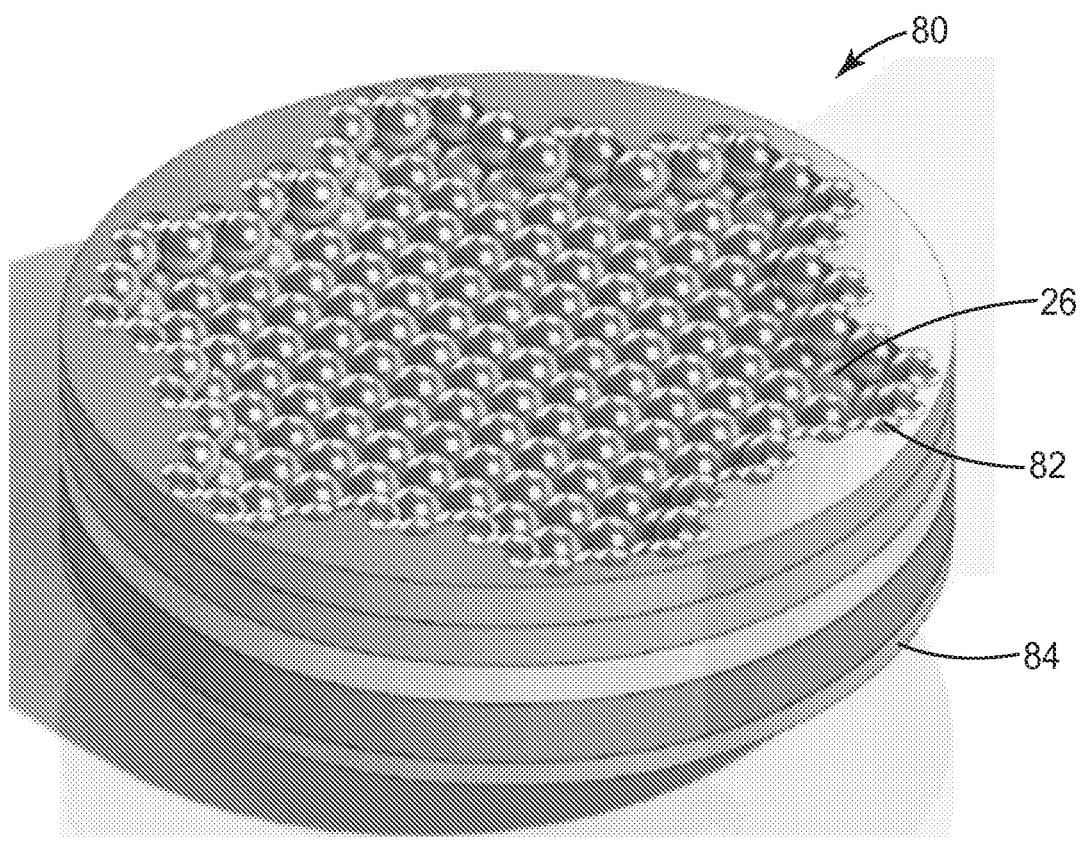
FIG. 10 shows a third step of packing a reactor of the present invention using a first method.

Dispensing and vibration continues until the exact number of optical elements which can fit within the first layer of the reactor have been dispensed and the first layer of optical elements is free from defects. After the defect free packing of the first layer has been completed, a second reactor wall section can be added as shown in FIG. 10. The process of dispensing and stacking can be repeated until the desired array size has been reached.

Figure 11:
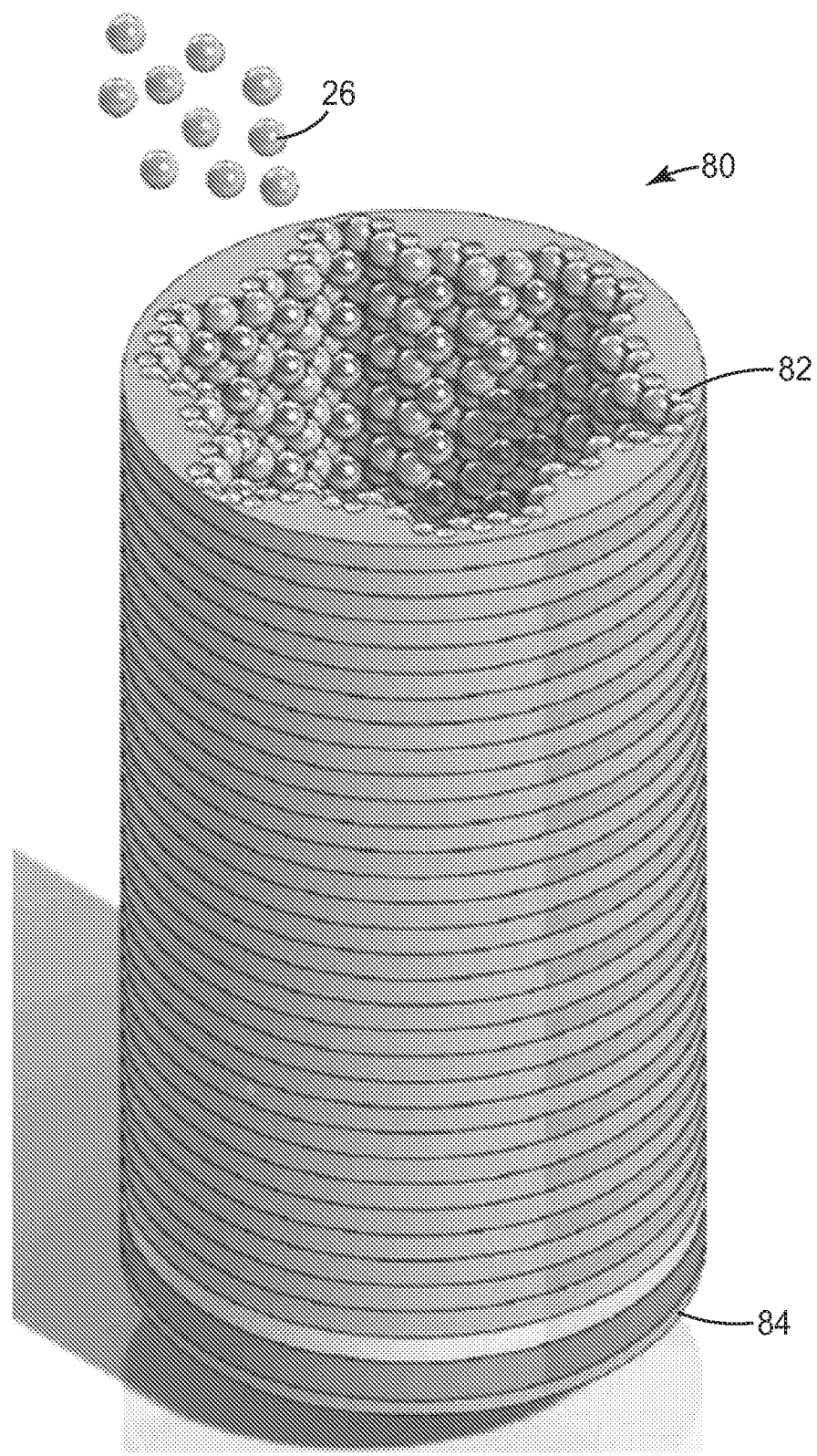
FIG. 11 shows a second method of packing a reactor of the present invention.

In a second method for packing a reactor 80, the reactor 80 is filled using layer by layer packing. Starting with a reactor that has the base 84 and all side wall 82 boundaries in place, as shown in FIG. 11, the specific number of optical elements 26 which are to fit in the first layer of the crystalline array are dispensed into the top of the reactor 80. In one embodiment, the optical elements are dispensed from a randomly packed reservoir. The optical elements can be poured from a container into the reactor, or dispensed one by one via a funnel or other means. As described in the first method, a vibration input may be applied in order to assist the proper formation of a crystalline layer without defects. Once the first layer has been built, a second round of optical elements is dispensed on top of the first layer. The process is repeated layer by layer until the reactor is filled to the top layer. In one embodiment, each layer may be coated with a material that can reduce the probability of scratching during each layer stacking process.

In a third method for packing a reactor, the reactor is filled using continuous filling. Starting with the same reactor setup as shown in FIG. 11, optical elements can be dispensed into the reactor at a constant rate until the entire reactor is filled. Unlike the first and second methods which dispense only a single layer of optical elements at a time, the dispense rate would be higher with this third method. Once again, as the optical elements are being dispensed, a vibration input may be simultaneously supplied to allow the optical elements to fall into proper alignment. In one embodiment, the dispensing rate may be slowed as the reactor approaches capacity in order to allow remaining defects or voids to fill and to allow more optical elements to be dispensed.

In a fourth method for packing the reactor, the reactor is filled using fully automated placement. A robotic dispensing apparatus which has a xyz programmable movement, in conjunction with an optical elements feeding mechanism, can place individual optical elements in precise locations one at a time. The automated process would dispense optical elements in a radial or linear fashion one layer at a time. This may be accomplished using a reactor layout that is built layer by layer as well, or using an assembled reactor layout as shown in FIG. 11 if the feed/dispenser head has an additional control axis.

The optical elements coated by the reactor and method of the present invention result in observable markings due to the geometry of how they are packed into the reactor. An optical point of contact of an optical element is defined as a point in which the coating is significantly different than the average coating structure. A regular point of contact of an optical element is defined as a point which is spaced between about 25 to about 35 degrees from the closest adjacent optical point of contact. In one embodiment, each optical point of contact is spaced about 30 degrees from the closest adjacent optical point of contact. Adjacent contact points are therefore spaced about 25 to about 35 degrees from each other, and particularly about 30 degrees from each other. The optical elements coated by the reactor and methods of the present invention have at least three regular points of contact in a 3-dimensional array. In some embodiments, the optical elements have at least six regular points of contact. In another embodiment, the optical elements have at least twelve regular point of contact. In one embodiment, at least 80% of the optical elements coated in a reactor by a method of the present invention have at least six regular points of contact.

The regular points of contact may be visible in some applications and thus, it may be desirable to position them on the optical elements in a way that minimizes impact. For example, the regular points of contact may be arranged such that the light transmitted by the regular points of contact are positioned where there will be minimal impact. Because the optical elements are not randomly arranged in the reactor, they can be appropriately positioned.

Optical elements with a dichroic coating have regular and repeated observable fiducials on the coating. In one embodiment, the dichroic coating on the optical elements covers at least 90% of the area of a sphere, a hemisphere, or a hemisphere truncated such that it has at least 40% of the thickness of a corresponding sphere, where the band edge varies by less than 5 nm over the surface and from spherical surface to spherical surface within the lot.

EXAMPLES

The present invention is more particularly described in the following examples that are intended as illustrations only, since numerous modifications and variations within the scope of the present invention will be apparent to those skilled in the art. Unless otherwise noted, all parts, percentages, and ratios reported in the following example are on a weight basis.

Figure 12:
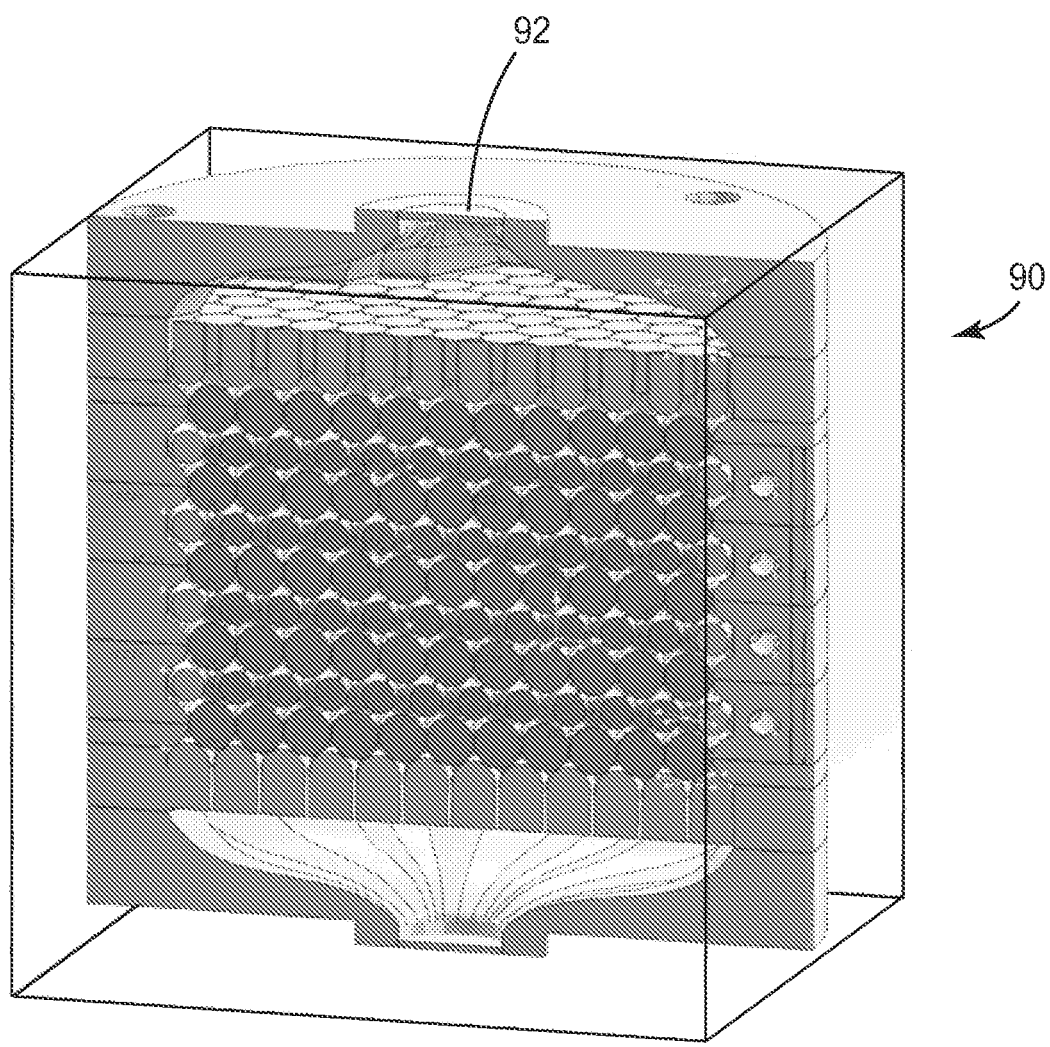
FIG. 12 shows a cross-sectional view of an exemplary simulated flow profile of a full transition boundary reactor.

FIG. 12 shows a first embodiment of a full transition boundary reactor 90. The atomic layer deposition (ALD) reactor flow was simulated using Solidworks Flow simulation version 2012 (available from Dassault Systemes Solidworks Corp, Waltham, Mass., USA). As can be seen by the flow simulations of the reactor under typical ALD conditions (1 Torr pressure, 200° C., 20 sccm of N2 carrier gas), the volume of the diffuser section at the top 92 of the reactor mixes the reactant with the purge gas—reducing the desired plug-flow conditions. The volume of the reactor may be increased to reduce the per-optical element coating cost.

Figure 13:
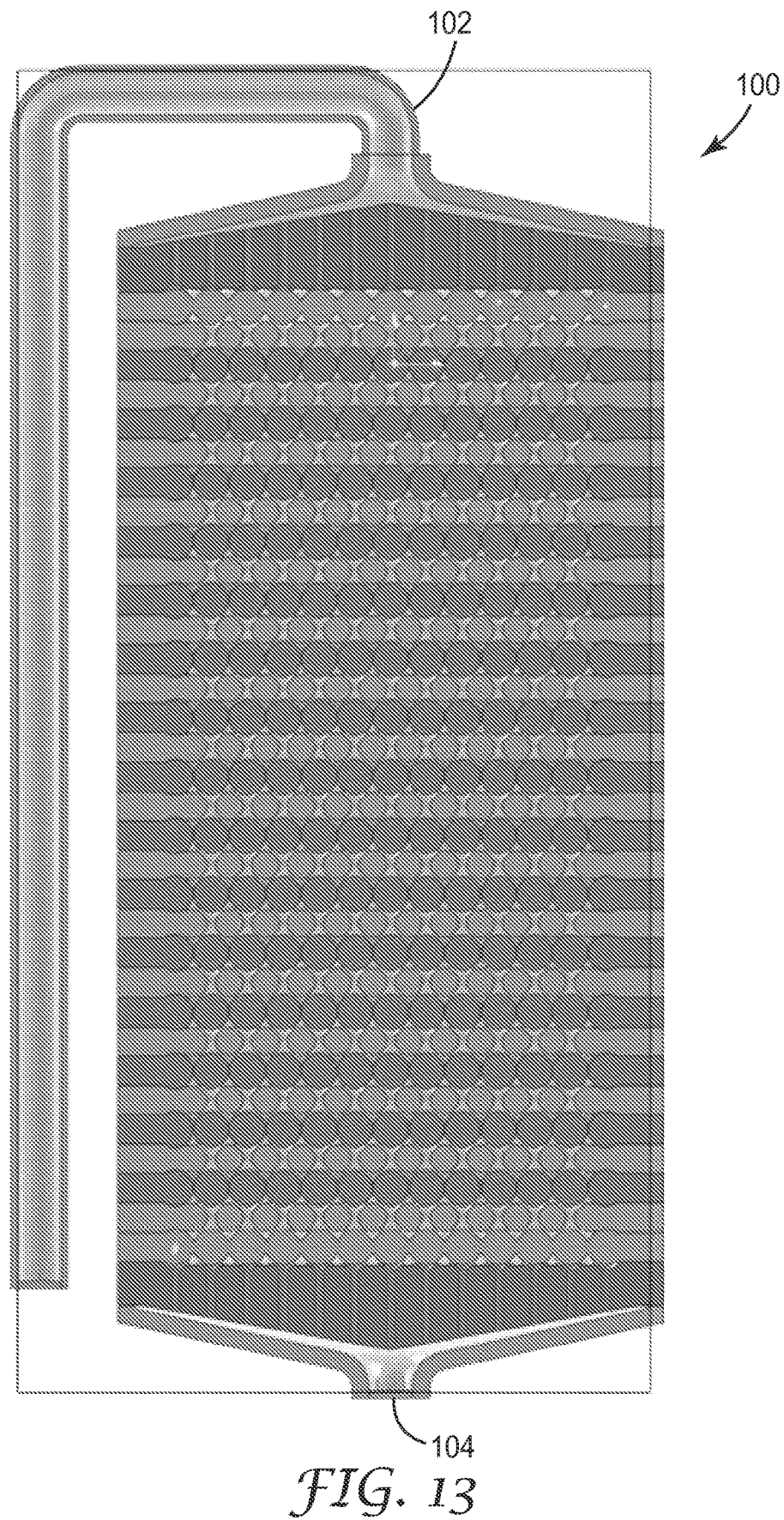
FIG. 13 shows a cross-sectional view of an exemplary simulated flow profile of a full transition boundary reactor.
Figure 14:
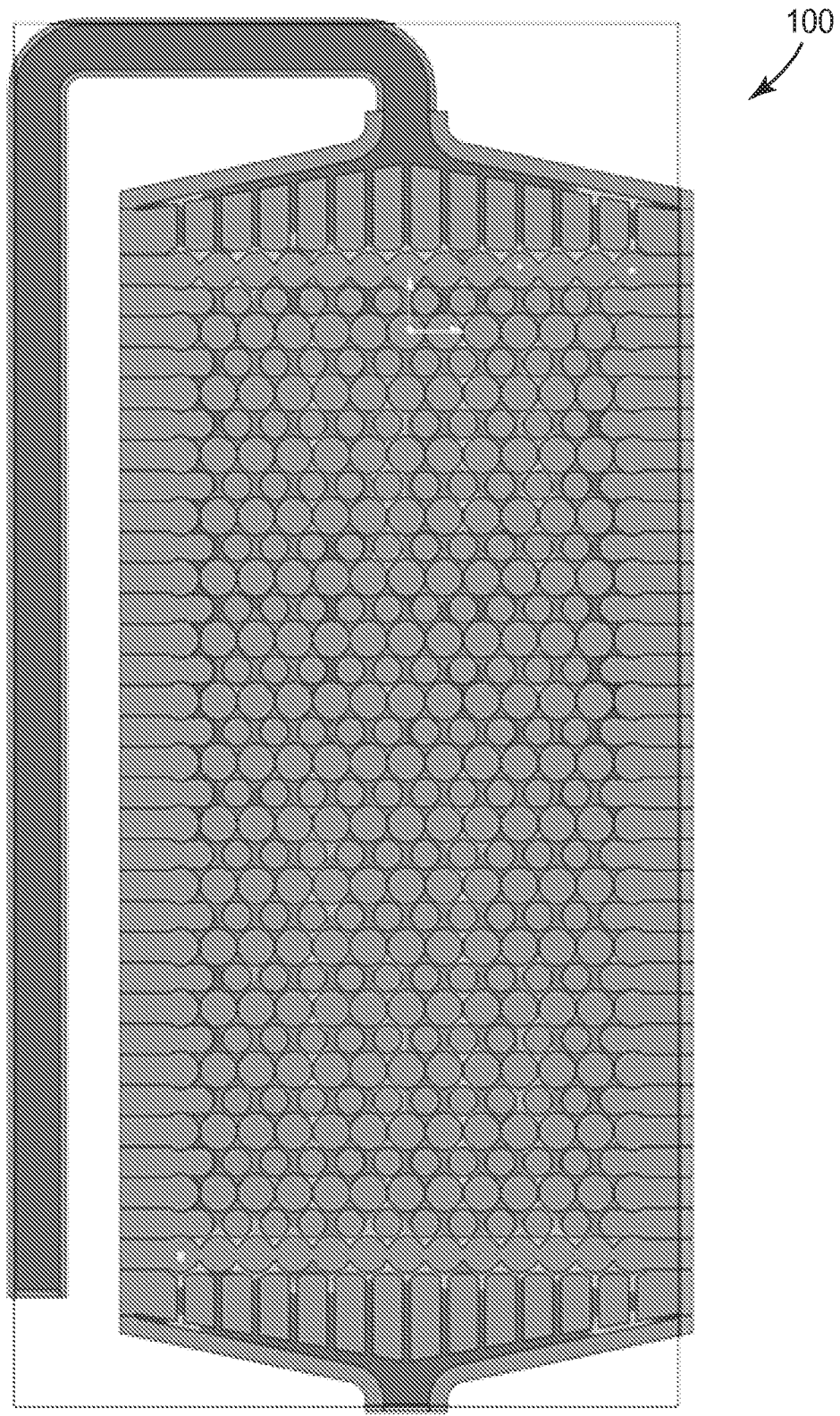
FIG. 14 shows a cross-sectional view of the exemplary simulated fully developed velocity profile of the full transition boundary reactor of FIG. 13 at 0.2 seconds.

FIG. 13 shows a second embodiment of a full transition boundary reactor with improved flow (i.e lower volume and mixing) and improved manufacturability. In the second embodiment, the gas flow occurs from the left and goes to the top 102 of the reactor and flows out the bottom 104. The reactor 100 works most efficiently in medium to low vacuum to just above atmospheric pressure. For example, the reactor 100 can operate at between about 0.1 Torr to above about 1 atmosphere pressure. In the simulation shown in FIG. 13, the ALD reactor flow was simulated with the boundary conditions being 20 sccm of a mixture of 21% oxygen and 79% nitrogen (air) for 0.20 seconds, followed with a 3 second purge of 100% nitrogen at the same flow rate. The bottom exhaust boundary condition was set for 1 Torr pressure. The reactor, the glass spheres, and the incoming gas were all set to 200° C. FIG. 14 shows the fully developed gas velocity profile of the reactor 100 of FIG. 13 at 0.2 seconds after starting the simulation. As can be seen in FIG. 14, the gas velocity is highly uniform across the cross-section of the reactor 100. The first row of spheres shown in FIGS. 13 and 14 is a permanent part of the reactor 100, serving both as a flow diffuser and to establish flow profiles similar to that of the rest of the reactor 100.

Figure 15:
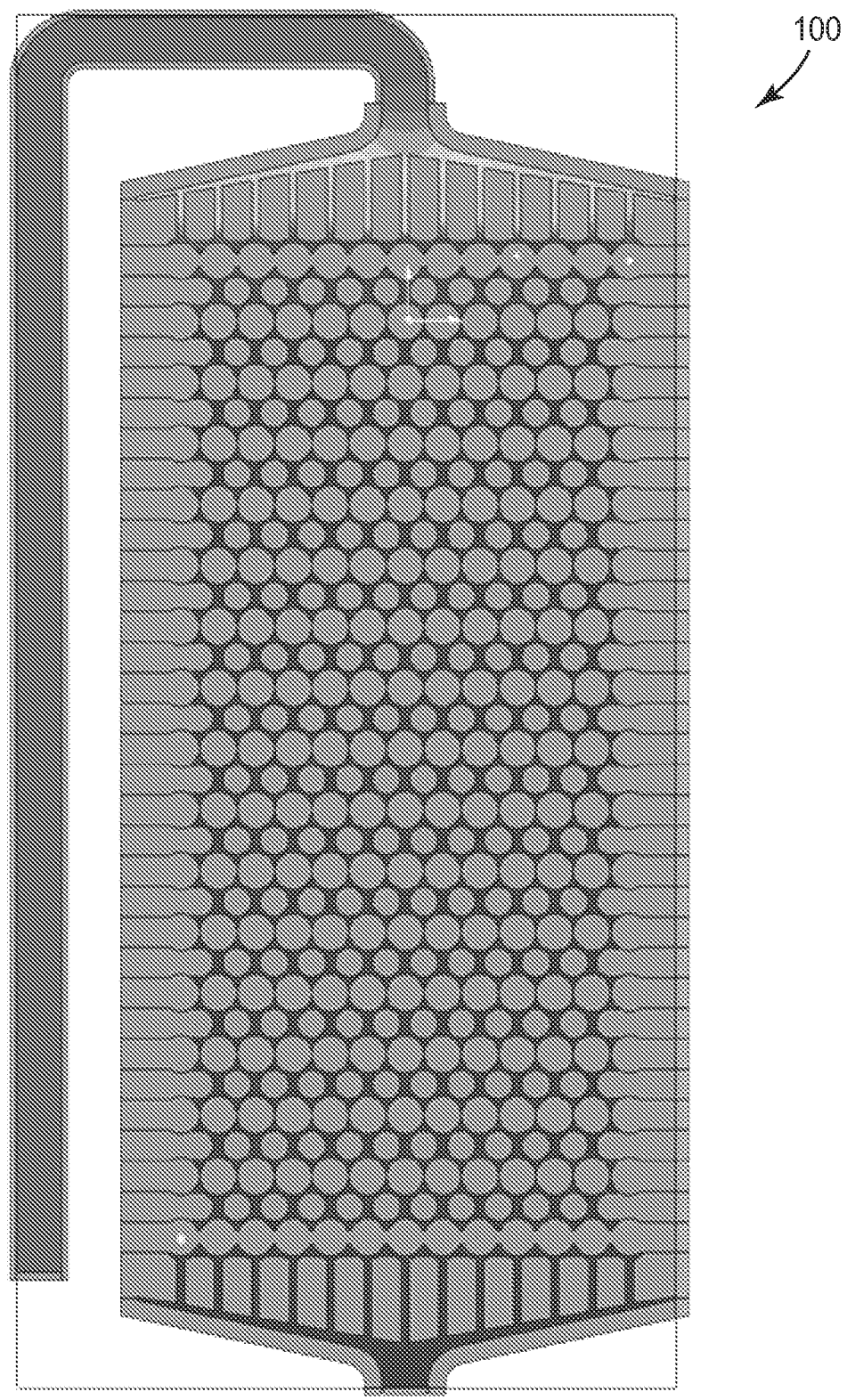
FIG. 15 shows a cross-sectional view of the exemplary simulated volume fraction of reactant of the full transition boundary reactor of FIG. 13 at 0.2 seconds.
Figure 16:
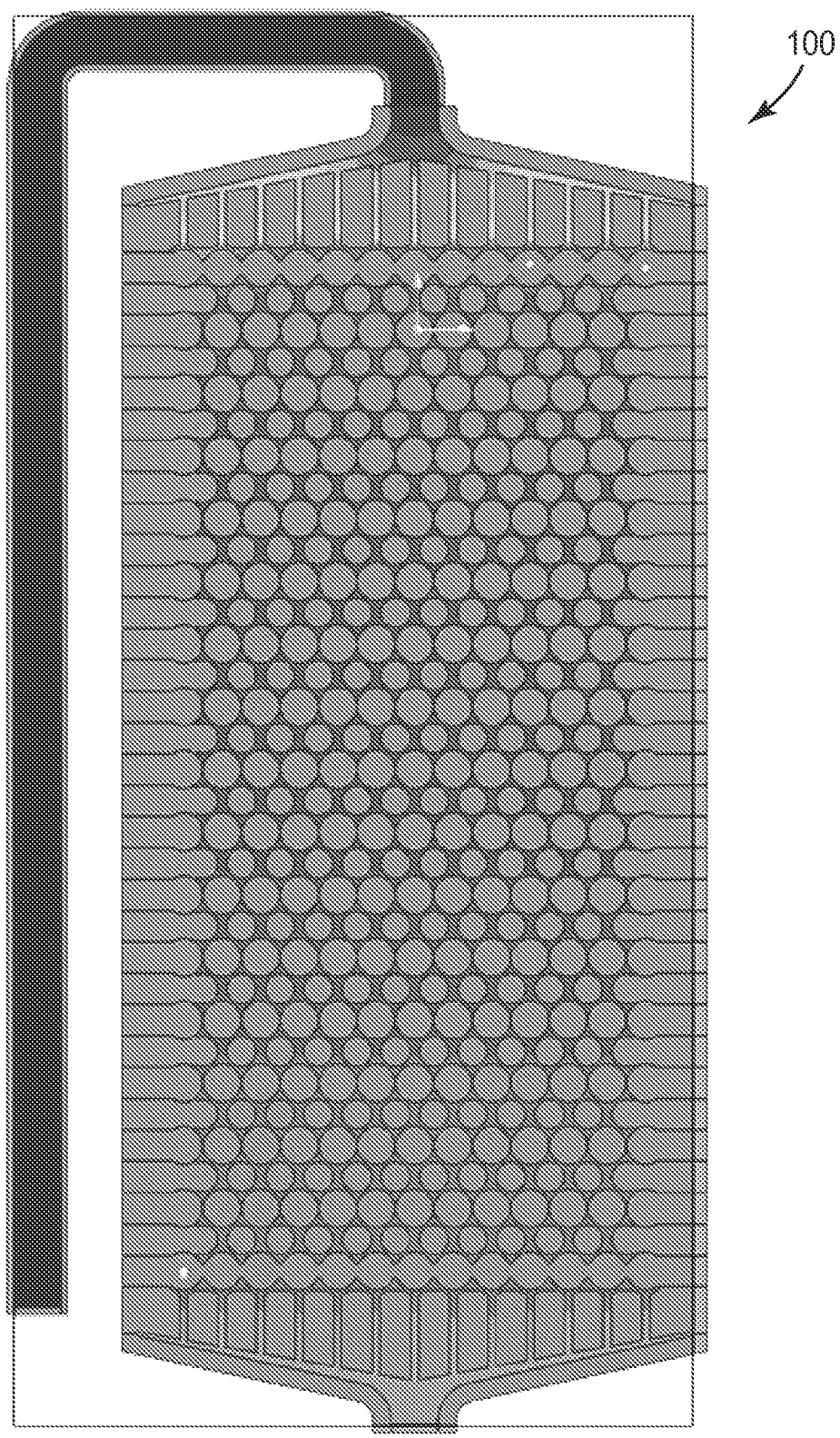
FIG. 16 shows a cross-sectional view of the exemplary simulated volume fraction of reactant of the full transition boundary reactor of FIG. 13 at 1 second.
Figure 17:
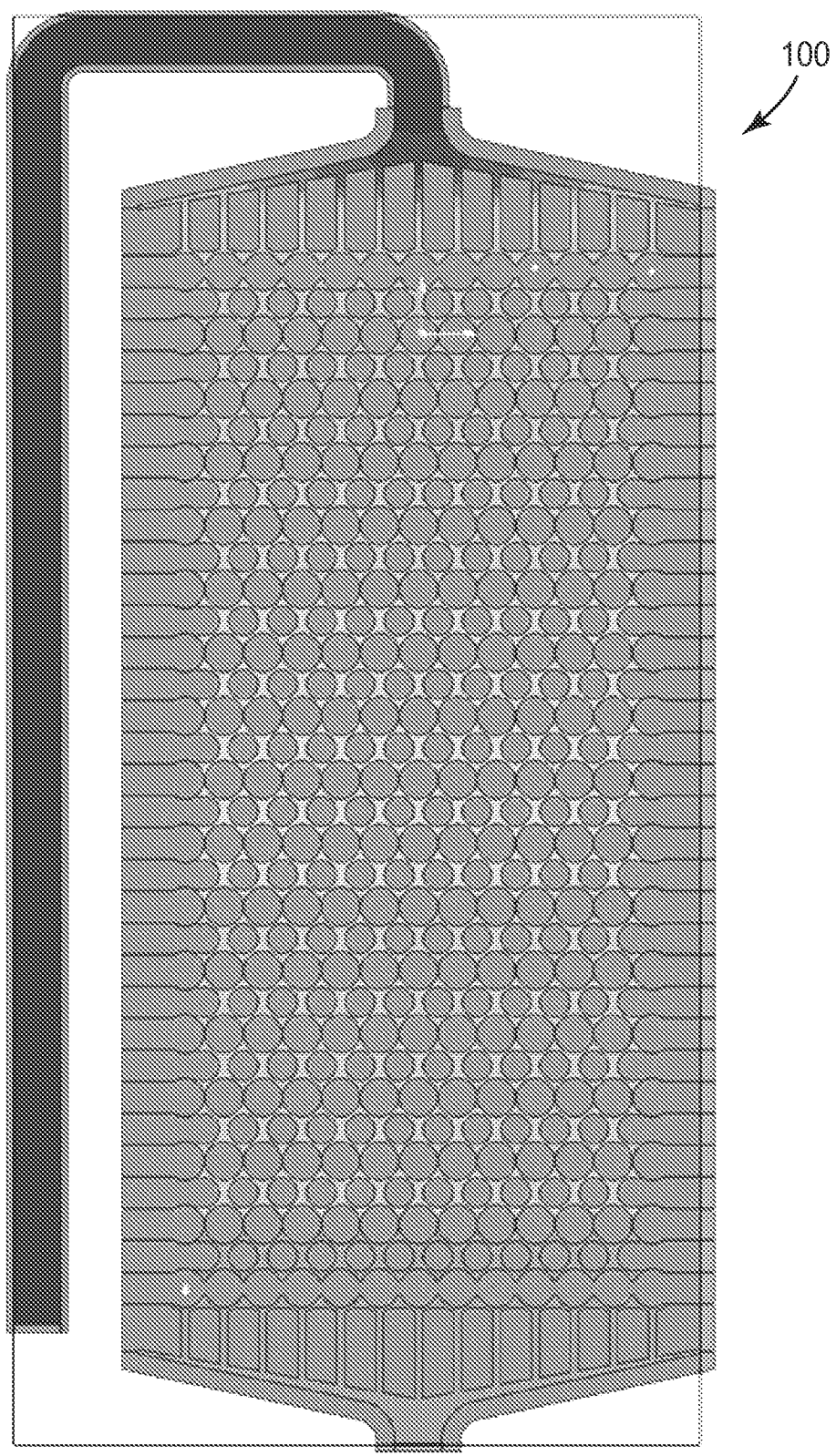
FIG. 17 shows a cross-sectional view of the exemplary simulated volume fraction of reactant of the full transition boundary reactor of FIG. 13 at 2 seconds.

FIGS. 15, 16, and 17 show that the "simulated reactant" (simulated as air, relative to the background flow of pure nitrogen gas) flows through the reactor 100 with a uniform profile, i.e. plug flow. FIG. 17 shows a fraction of simulated reactant (air) at 0.2 seconds. The darker shading is 1.0 or 100% reactant and the lighter shading is 0 or 0% reactant, indicating that the reactant just reached the initial optical elements. FIG. 18 shows a fraction of simulated reactant at 1 second. The darker shading is 0.0544 or 5.44% reactant concentration and the lighter shading is 0 or 0%, indicating that the inlet line of the reactor has been fully purged. FIG. 19 shows a fraction of simulated reactant at 2 seconds. The darker shading is 0.0544 or 5.44% reactant concentration and the lighter shading is 0 or 0%, indicating that the inlet line of the reactor has been fully purged and has much of the inlet port of the mixing manifold. As can be seen in the figures, while the low pressure and high temperature lead to a great deal of diffusion, the exposure of the optical elements is uniform from the beginning (top) to the end (bottom) of the reactor.

Although the present invention has been described with reference to preferred embodiments, workers skilled in the art will recognize that changes may be made in form and detail without departing from the spirit and scope of the invention.

What is claimed is:

1. A method of coating uniformly shaped and sized articles comprising:
   providing a reactor having a total interior volume, the total interior volume bounded by an inner surface of the reactor, the inner surface comprising bottom and top surfaces and side wall surfaces extending from the bottom to the top surface, at least one of the side wall surfaces being an arrayed surface comprising an array of surface structures, each surface structure in the array of surface structures comprising a surface of a partial sphere;
   positioning the articles within the reactor such that adjacent articles contact each other; and coating the articles.

2. The method of claim 1, wherein each side wall surface, the bottom surface and the top surface are arrayed surfaces.

3. The method of claim 1, wherein the arrayed surface corresponds to a shape of an outer perimeter of the articles.

4. The method of claim 1, wherein positioning the articles within the reactor comprises positioning the articles layer by layer.

5. The method of claim 1, wherein when the articles are positioned in the reactor, the reactor forms an infinite boundary.

6. The method of claim 1, wherein when the articles are positioned in the reactor, the reactor forms a semi-infinite boundary.

7. The method of claim 1, wherein coating the articles comprises coating by one of atomic layer deposition and low pressure chemical vapor deposition.

8. The method of claim 1, further comprising applying vibrations to the reactor while positioning the articles within the reactor.

9. The method of claim 1, wherein positioning the articles within the reactor comprises packing the articles such that a diameter of the packed articles substantially fits within a diameter of the reactor.

10. The method of claim 1, wherein at least 80% of the coated articles have at least six regular points of contact with adjacent coated articles.

11. The method of claim 1, wherein each coated article has points of contact with adjacent coated articles that subtend an angle between about 25 to about 35 degrees at a center of the coated article.

12. The method of claim 1, wherein coating the articles results in a plurality of coated articles, at least one of the coated articles being a coated optical element having at least six contact points not all in a same plane, each contact point being an optical point of contact, wherein adjacent contact points subtend an angle between about 25 to about 35 degrees at a center of the coated optical element.

13. The method of claim 12, wherein for each contact point, the contact point and a closest adjacent contact point subtend an angle of about 30 degrees at the center of the coated optical element.

14. A reactor for coating uniformly shaped and sized articles, the reactor comprising:

a total interior volume bounded by an inner surface of the reactor, the inner surface comprising bottom and top surfaces and side wall surfaces extending from the bottom to the top surface, at least one of the side wall surfaces being an arrayed surface comprising an array of surface structures, each surface structure in the array of surface structures comprising a surface of a partial sphere, wherein the arrayed surface matches a profile of adjacent articles.

15. The reactor of claim 14, wherein each of the bottom surface, the top surface, and each side wall surface is arrayed.

16. The reactor of claim 14, wherein the reactor is a full transition boundary reactor.

* * * * *